United States Patent [19]

Oh

[11] Patent Number: 5,608,680
[45] Date of Patent: Mar. 4, 1997

[54] BIT LINE SENSE AMPLIFIER FOR RESTORING AND SENSING DATA ON A BIT LINE

[75] Inventor: Young N. Oh, Kyoungki-do, Rep. of Korea

[73] Assignee: Hyundai Electronics Industries Co., Ltd., Kyoungki-do, Rep. of Korea

[21] Appl. No.: 504,082

[22] Filed: Jul. 19, 1995

[30] Foreign Application Priority Data

Jul. 20, 1994 [KR] Rep. of Korea ..................... 94-17553

[51] Int. Cl.$^6$ ............................................. G11C 11/24
[52] U.S. Cl. ........................... 365/205; 365/203; 365/207; 365/208
[58] Field of Search ...................................... 365/203, 205, 365/207, 208

[56] References Cited

U.S. PATENT DOCUMENTS 4,780,850  10/1988  Miyamoto et al. ................ 365/203
4,980,862  12/1990  Foss ................................... 365/203
5,313,426   5/1994  Sakuma et al. .................... 365/205

*Primary Examiner*—David C. Nelms
*Assistant Examiner*—Vu A. Le
*Attorney, Agent, or Firm*—Gary M. Nath; Nath & Associates

[57] ABSTRACT

A bit line sense amplifier circuit for restoring and sensing data on a bit line in a semiconductor device. The bit line sense amplifier circuit comprises a first restore signal circuit including a PMOS transistor. The PMOS transistor is operated in response to a first clock signal. The bit line sense amplifier circuit further comprises a first sensing signal circuit including an NMOS transistor. The NMOS transistor is operated in response to a second clock signal. The bit line sense amplifier circuit further comprises a second restore signal circuit being operated in response to a first control signal and a third clock signal, and a second sensing signal circuit being operated in response to a second control signal and a fourth clock signal. The first and second restore signal circuits are connected in parallel to each other. Similarly, the first and second sensing signal circuits are connected in parallel to each other.

5 Claims, 4 Drawing Sheets

BIT LINE SENSE AMPLIFIER FOR RESTORING AND SENSING DATA ON A BIT LINE

BACKGROUND OF THE INVENTION

1. Field of the Invention

The present invention related in general to bit line sense amplifier circuits and more particularly to a bit line sense amplifier circuit in which a voltage controllable driver is used in generating a restore signal or a sensing signal, the voltage controllable driver performing a voltage switching operation in response to a control signal to reduce the noise component in power supply lines.

2. Description of the Prior Art

Referring to FIG. 1, there is shown a circuit diagram of a conventional bit line sense amplifier circuit. As shown in this drawing, the conventional bit lie sense amplifier circuit comprises a bit line sense amplifier 11 for sensing data on a bit line, a precharge circuit 12 for precharging P-channel and N-channel cross coupled latch enable signals rtoi and sbi, a restore signal circuit 13, and a sensing signal circuit 14.

The operation of the conventional bit line sense amplifier circuit with the above-mentioned construction will hereinafter be described with reference to an operating timing diagram of FIG. 2.

The bit line sense amplifier 11 includes a P-channel cross coupled latch an N-channel cross coupled latch, a bit line precharge circuit, a memory cell and a column select circuit.

In the bit line sense amplifier 11, the bit line is precharged with a voltage level Vblp (about Vcc/2) at a precharge state. Namely, at the precharge state, a control signal blp2 becomes high in logic under the condition that a signal /RAS is high in logic. As a result, NMOS transistor Q5–Q7 are turned on to precharge the bit line with the voltage level Vblp (about Vcc/2).

At an active state, the control signal blp2 goes from high to low in logic under the condition that the signal /RAS is low in logic. As a result, the bit line becomes floated.

On the other hand, if a word line wl is enabled, an NMOS transistor Q10 is turned on to transfer a voltage stored on a capacitor cs to the bit line. As a result, a voltage ΔV is added to an initial voltage or Vcc/2 on the bit line.

The column select circuit is used for the data transfer between bit lines BL and /BL and data bus lines db and /db when a control singal yi is high in logic.

The precharge circuit 12 includes three NMOS transistors Q11–Q13. The NMOS transistor Q11 has a gate terminal for inputting a control signal blp1, a drain terminal for inputting the voltage Vblp and a source terminal connected to a node N3. The NMOS transistor Q12 has a gate terminal for inputting the control signal blp1, a drain terminal for inputting the voltage Vblp and a source terminal connected to a node N4. The NMOS transistor Q13 has a gate terminal for inputting the control signal blp1, a drain terminal connected to the node N3 and a source terminal connected to the node N4.

In the precharge circuit 12, the P-channel and N-channel cross coupled latch enable signals rtoi and sbi are precharged with the voltage level Vblp at the precharge state. Namely, at the precharge state, the control signal blp1 becomes high in logic under the condition that the signal /RAS is high in logic. As a result, the NMOS transistors Q11–Q13 are turned on to precharge the P-channel and N-channel cross coupled latch enable signals rtoi and sbi with the voltage level Vblp.

At the active state, the control signal blp1 goes from high to low in logic under the condition that the signal /RAS is low in logic. As a result, the P-channel and N-channel cross coupled latch enable signals rtoi and sbi become floated so that the restore and sensing signal circuits 13 and 14 can be operated respectively in response to clock signals /R1 and S1 being enabled after a predetermined time delay from the control signal blp1.

The restore signal circuit 13 includes a PMOS transistor Q14. The PMOS transistor Q14 has a gate terminal for inputting the clock signal /R1, a drain terminal connected to a supply voltage source Vcc and a source terminal connected to the node N3.

When the clock signal /R1 goes from high to low in logic, the PMOS transistor Q14 is turned on to transfer a supply voltage from the supply voltage source Vcc to the node N3. As a result, the P-channel cross coupled latch is operated in response to the supply voltage on the node N3. The P-channel cross coupled latch is provided with two PMOS transistors Q1 and Q2.

The sensing signal circuit 14 includes an NMOS transistor Q15. The NMOS transistor Q15 has a great terminal for inputting the clock signal S1, a drain terminal connected to the node N4 and a source terminal connected to a ground voltage source Vss.

When the clock signal S1 goes from low to high in logic, the NMOS transistor Q15 is turned on to transfer a ground voltage from the ground voltage source Vss to the node N4. As a result, the N-channel cross coupled latch is operated in response to the ground voltage on the node N4. The N-channel cross coupled latch is provided with two NMOS transistors Q3 and Q4.

In the above-mentioned conventional bit line sense amplifier, the P-channel and N-channel cross coupled latch enable signals rtoi and sbi may be coupled to a plurality of sense amplifiers, i.e., 1K or more. For this reason, when the P-channel and N-channel cross coupled latch enable signals rtoi and sbi are operated as restore and sensing signals in response to the enable clocks /R1 and S1, respectively, abrupt current flow di/dt may occur in the PMOS transistor Q14 and the NMOS transistor Q15, resulting in the generation of a noise component in the power supply lines Vcc and Vss. Further, the noise component is significantly increased according to a variation of the supply voltage, resulting in a faulty operation of the circuit.

SUMMARY OF THE INVENTION

Therefore, the present invention has been made in view of the above problem, and it is an object of the present invention to provide a bit line sense amplifier circuit in which a voltage switching circuit is provided to control an instantaneous current amount di/dt in a restore signal circuit and a sensing signal circuit, so as to reduce the noise component in power supply lines.

In accordance with the present invention, the above and other objects can be accomplished by a provision of a bit line sense amplifier circuit for restoring and sensing data on a bit line in a semiconductor device, comprising a first restore signal circuit including a first PMOS transistor, the first PMOS transistor being operated in response to a first clock signal; a first sensing signal circuit including a first NMOS transistor, the first NMOS transistor being operated in response to a second clock signal; a second restore signal circuit being operated in response to a first control signal and a third clock signal; and a second sensing signal circuit being operated in response to a second control signal and a fourth clock signal; the first and second restore signal circuits being connected in parallel to each other; the first and second sensing signal circuits being connected in parallel to each other.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
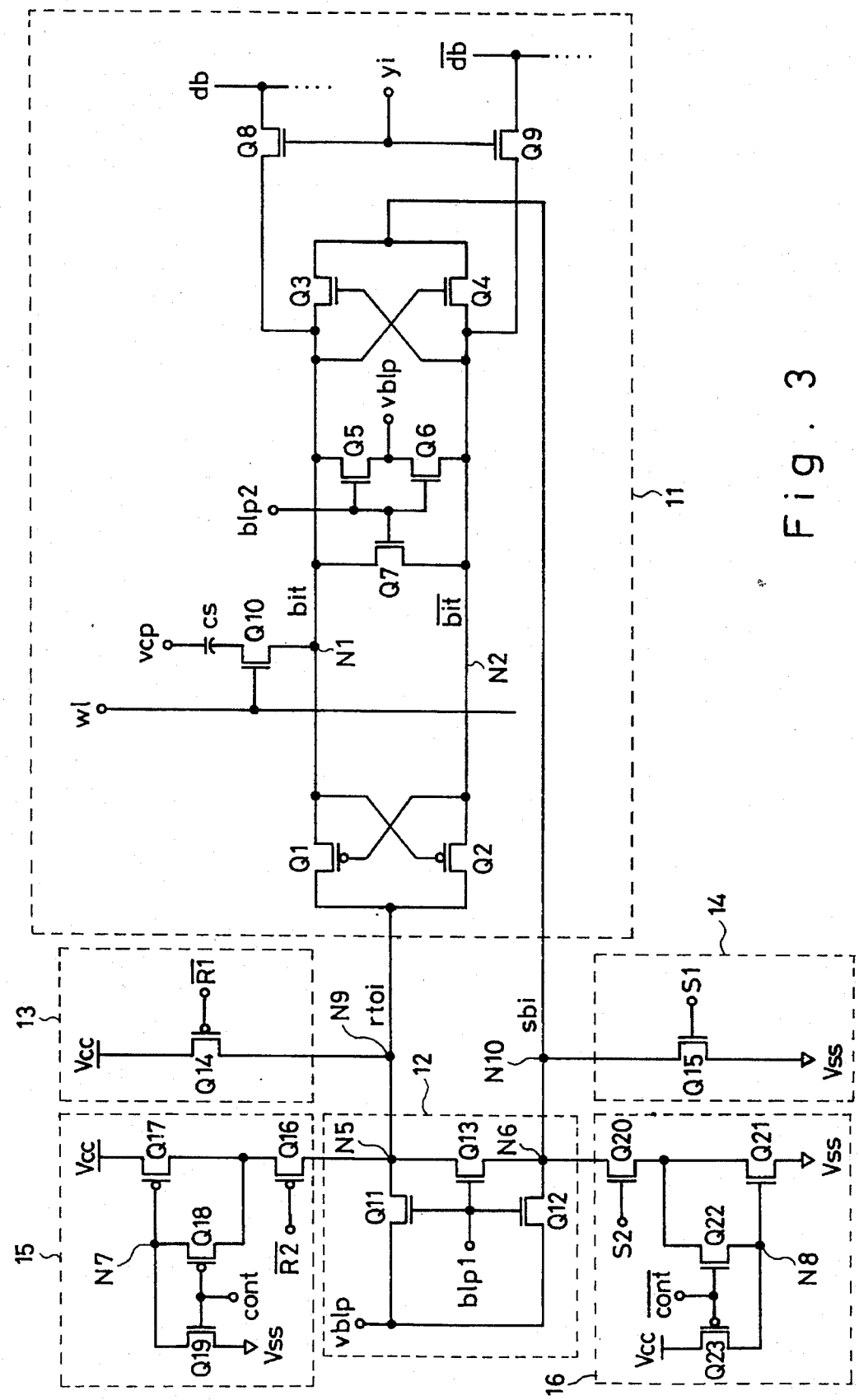
FIG. 3 is a circuit diagram of a bit line sense amplifier circuit in accordance with an embodiment of the present invention.

Referring to FIG. 3, there is shown a circuit diagram of a bit line sense amplifier circuit in accordance with an embodiment of the present invention. Some parts in this drawing are substantially the same as those in FIG. 1. Therefore, like reference numerals designate like parts.

As shown in FIG. 3, the bit line sense amplifier circuit comprises a bit line sense amplifier 11 for sensing data on a bit line, and a precharge circuit 12 for precharging P-channel and N-channel cross coupled latch enable signals rtoi and sbi.

The bit line sense amplifier circuit further comprises first and second restore signal circuits 13 and 15 and first and second sensing signal circuits 14 and 16, each of which includes an active driver.

Figure 1:
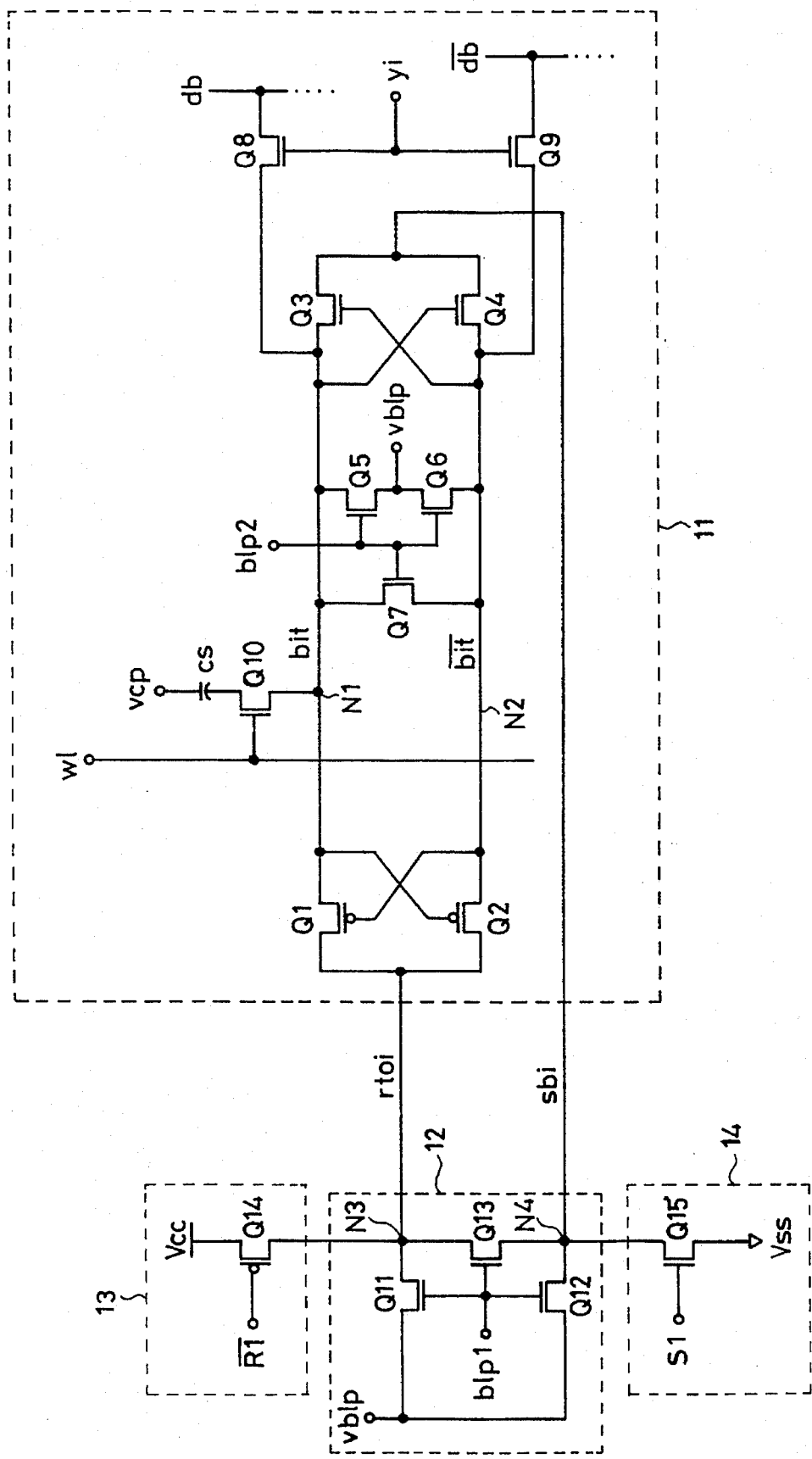
FIG. 1 is a circuit diagram of a conventional bit line sense amplifier circuit.
Figure 2:
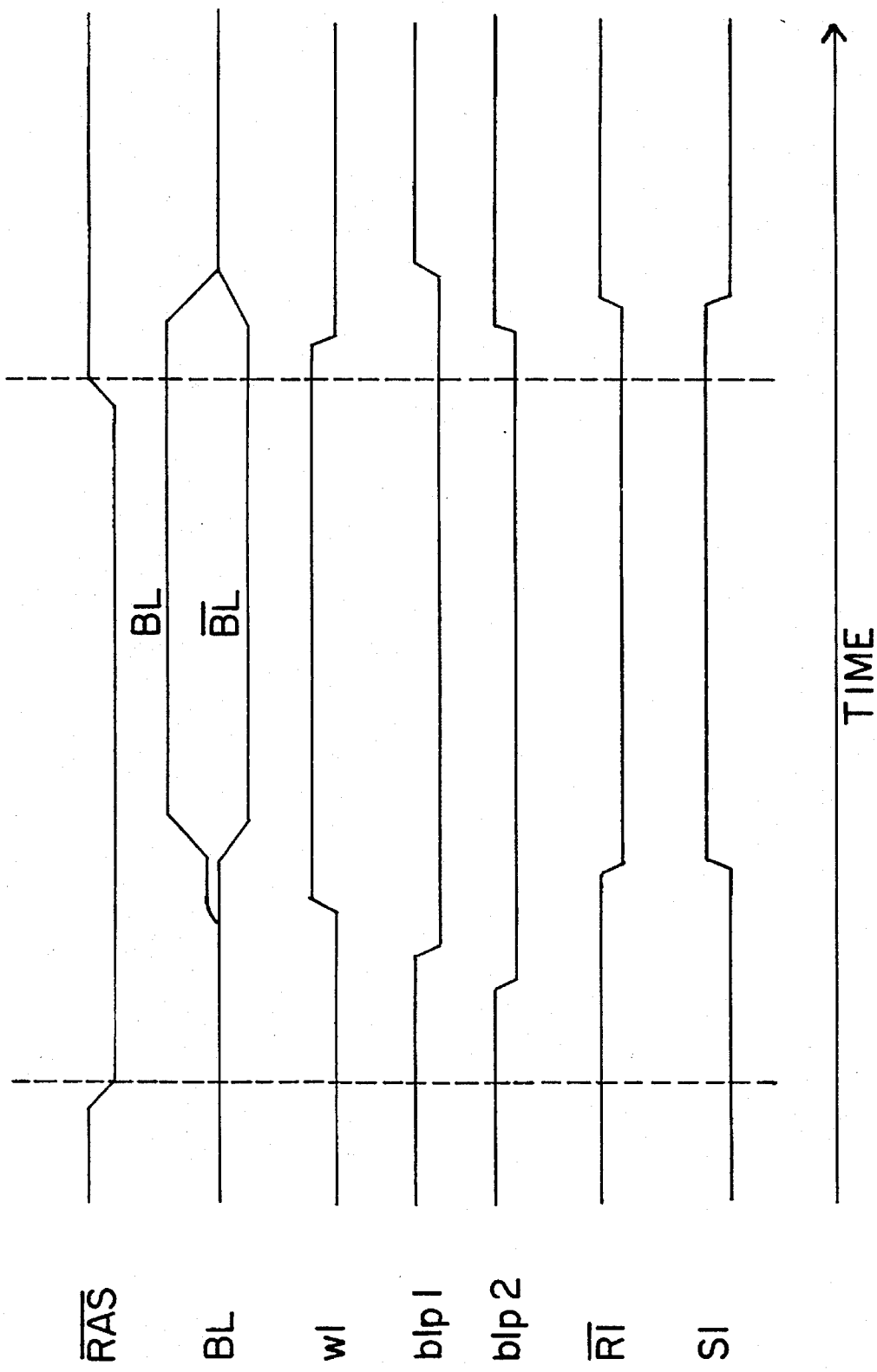
FIG. 2 is a timing diagram illustrating the operation of the conventional bit line sense amplifier circuit in FIG. 1.

The bit line sense amplifier 11 is the same in construction and operation as that in FIG. 1 and details thereof will thus be omitted.

The precharge circuit 12 includes three NMOS transistors Q11–Q13. The NMOS transistor Q11 has a gate terminal for inputting a control signal blp1, a drain terminal for inputting a voltage Vblp and a source terminal connected to a node N5. The NMOS transistor Q12 has a gate terminal for inputting the control signal blp1, a drain terminal for inputting the voltage Vblp and a source terminal connected to a node N6. The NMOS transistor Q13 has a gate terminal for inputting the control signal blp1, a drain terminal connected to the node N5 and a source terminal connected to the node N6.

In the precharge circuit 12, the P-channel and N-channel cross coupled latch enable signals rtoi and sbi are precharged with the voltage level Vblp at a precharge state. Namely, at the precharge state, the control signal blp1 becomes high in logic under the condition that a signal /RAS is high in logic. As a result, the NMOS transistors Q11–Q13 are turned on to precharge the P-channel and N-channel cross coupled latch enable signals rtoi and sbi with the voltage level Vblp.

At an active state, the control signal blp1 goes from high to low in logic under the condition that the signal /RAS is low in logic. As a result, the P-channel and N-channel cross coupled latch enable signals rtoi and sbi become floated so that the first and second restore signal circuits 13 and 15 and the first and second sensing signal circuits 14 and 16 can be operated respectively in response to clock signals /R1, R2, S1 and S2 and control signals cont and /cont being enabled after a predetermined time delay from the control signal blp1.

The first restore signal circuit 13 includes a PMOS transistor Q14. The PMOS transistor Q14 has a gate terminal for inputting the clock signal /R1, a drain terminal connected to a supply voltage source Vcc and source terminal connected to a node N9.

When the clock signal /R1 goes from high to low in logic, the PMOS transistor Q14 is turned on to transfer a supply voltage from the supply voltage source Vcc to the node N9.

The second restore signal circuit 15 includes a voltage switching circuit being operated in response to the control signal cont, and a driver being operated in response to the clock signal /R2. The voltage switching circuit includes two PMOS transistors Q17 and Q18 and an NMOS transistor Q19. The driver is provided with a PMOS transistor Q16.

In the second restore signal circuit 15, the PMOS transistor Q18 has a gate terminal for inputting the control signal cont, a drain terminal connected in common to a gate terminal of the PMOS transistor Q17 and a drain terminal of the NMOS transistor Q19 and a source terminal connected in common to a source terminal of the PMOS transistor Q17 and a drain terminal of the PMOS transistor Q16. The NMOS transistor Q19 has a gate terminal for inputting the control signal cont and a source terminal connected to a ground voltage source Vss. The PMOS transistor Q17 has a drain terminal connected to the supply voltage source Vcc. The PMOS transistor Q16 has a gate terminal for inputting the clock signal /R2 and a source terminal connected to the node N5.

The control signal cont may be generated from a fuse, a bond pad or a voltage detector to torn on/off the PMOS transistor Q18 and the NMOS transistor Q19, so as to determine a voltage level on a node N7. The control signal cont may be coupled with the signal /RAS to switch a control voltage.

When the clock signal /R2 goes from high to low in logic, the PMOS transistor Q16 is turned on to transfer the voltage on the node N7 to the node N5.

For example, if the control signal cont is low in logic, the PMOS transistor Q18 is turned on. In this case, the PMOS transistor Q17 has a diode characteristic. When the clock signals /R1 and /R2 are changed from high to low in logic, the PMOS transistors Q14 and Q16 are turned on. As a result, the supply voltage from the supply voltage source Vcc is transferred to the node N9 through the PMOS transistor Q14. Also, a voltage Vcc-Vtp is transferred to the node N5 through the PMOS transistor Q17 and Q16.

On the contrary, if the control signal cont is high in logic, the NMOS transistor Q19 is turned on to transfer a ground voltage from the ground voltage source Vss to the node N7, thereby causing the PMOS transistor Q17 to be turned on. When the clock signals /R1 and /R2 are changed from high to low in logic, the PMOS transistors Q14 and Q16 are turned on. As a result, the supply voltage from the supply voltage source Vcc is transferred to the node N9 through the PMOS transistor Q14. The supply voltage from the supply voltage source Vcc is also transferred to the node N5 through the PMOS transistors Q17 and Q16.

The first sensing signal circuit 14 includes an NMOS transistor Q15. The NMOS transistor Q15 has a gate terminal for inputting the clock signal S1, a drain terminal connected to a node N10 and a source terminal connected to the ground voltage source Vss.

When the clock signal S1 goes from low to high in logic, the NMOS transistor Q15 is turned on to transfer the ground voltage from the ground voltage source Vss to the node N10.

The second sensing signal circuit 16 includes a voltage switching circuit being operated in response to the control signal /cont, and a driver being operated in response to the clock signal S2. The voltage switching circuit includes two NMOS transistors Q21 and Q22 and a PMOS transistor Q23. The driver is provided with an NMOS transistor Q20.

In the second sensing signal circuit 16, the NMOS transistor Q22 has a gate terminal for inputting the control signal /cont, a source terminal connected in common to a gate terminal of the NMOS transistor Q21 and a source terminal of the PMOS transistor Q23 and a drain terminal connected in common to a drain terminal of the NMOS transistor Q21 and a source terminal of the NMOS transistor Q20. The PMOS transistor Q23 has a gate terminal for inputting the control signal /cont and a drain terminal connected to the supply voltage source Vcc. The NMOS transistor Q21 has a source terminal connected to the ground voltage source Vss. The NMOS transistor Q20 has a gate terminal for inputting the clock signal S2 and a drain terminal connected to the node N6.

The control signal /cont may be generated from a fuse, a bond pad or a voltage detector to turn on/off the NMOS transistor Q22 and the PMOS transistor Q23, so as to determine a voltage level on a node N8. The control signal /cont may be coupled with the signal /RAS to switch a control voltage.

When the clock signal S2 goes from low to high in logic, the NMOS transistor Q20 is turned on to transfer the voltage on the node N8 to the node N6.

For example, if the control signal /cont is high in logic, the NMOS transistor Q22 is turned on. In this case, the NMOS transistor Q21 has a diode characteristic. When the clock signals S1 and S2 are changed from low to high in logic, the NMOS transistors Q15 and Q20 are turned on. As a result, a voltage on the node N10 is discharged to the ground voltage source Vss through the NMOS transistor Q15. Also, a voltage on the node N6 is not discharged to the ground voltage source through the NMOS transistors Q20 and Q21.

On the contrary, if the control signal /cont is low in logic, the PMOS transistor Q23 is turned on to transfer the supply voltage from the supply voltage source Vcc to the node N8, thereby causing the NMOS transistor Q21 to be turned on. When the clock signals S1 and S2 are changed from low to high in logic, the NMOS transistors Q15 and Q20 are turned on. As a result, the voltage on the node N10 is discharged to the ground voltage source Vss through the RMOS transistor Q15. Also, the voltage on the node N6 is discharged to the ground voltage source through the NMOS transistors Q20 and Q21.

In this manner, a 2-parallel driver structure is used to control a voltage of the load, or the P-channel or N-channel cross coupled latch enable signal rtoi or sbi in response to the control signal cont or /cont. Therefore, the use of the 2-parallel driver structure has the effect of preventing an abrupt variation in an instantaneous current amount di/dt in the power supply lines Vcc and Vss.

Figure 4:
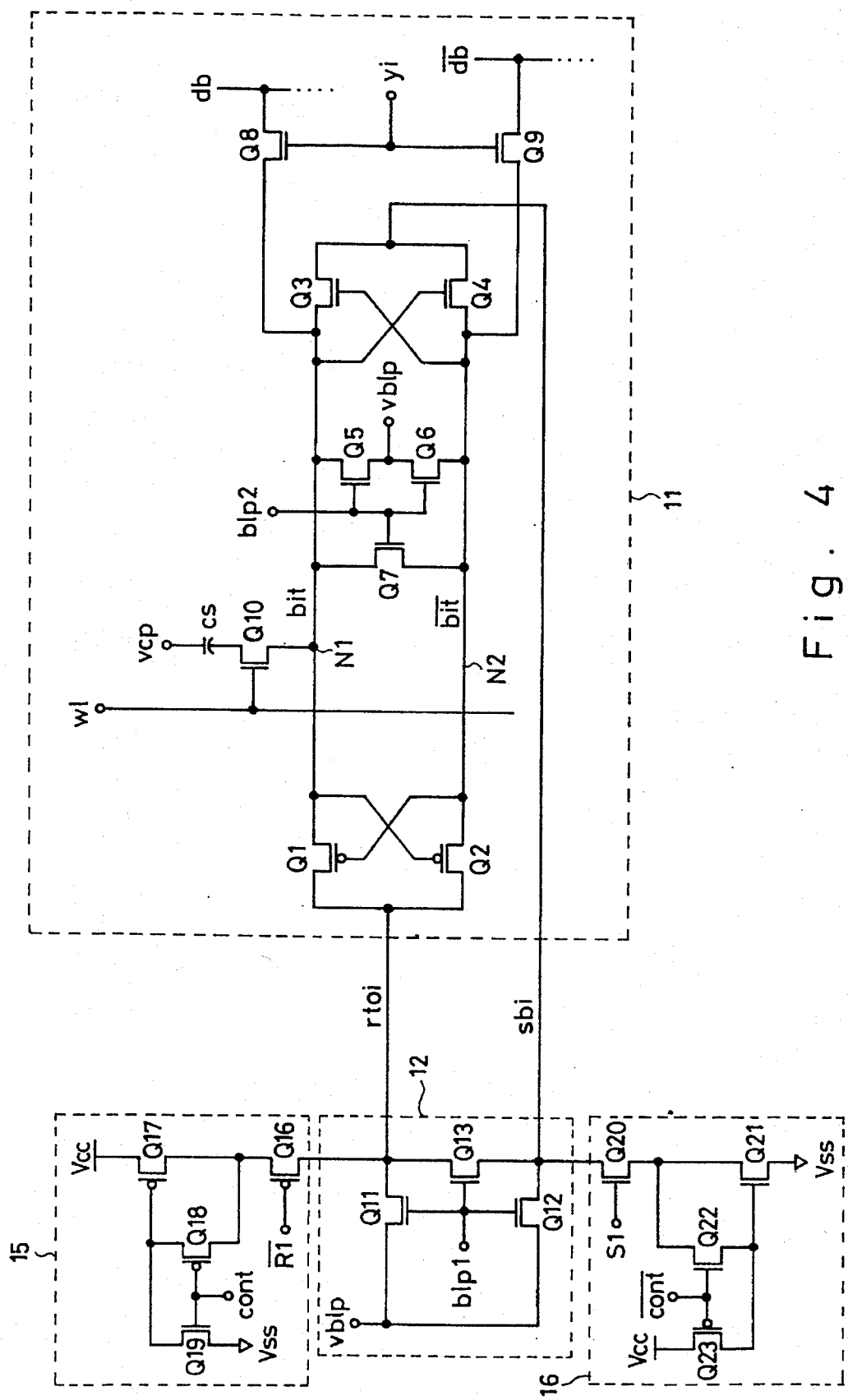
FIG. 4 is a circuit diagram of a bit line sense amplifier circuit in accordance with an alternative embodiment of the present invention.

Referring to FIG. 4, there is shown a circuit diagram of a bit line sense amplifier circuit in accordance with an alternative embodiment of the present invention. Some parts in this drawing are substantially the same as those in FIG. 3. Therefore, like reference numerals designate like parts.

As shown in FIG. 4, the bit line sense amplifier circuit comprises a bit line sense amplifier 11 for sensing data on a bit line, and a precharge circuit 12 for precharging P-channel and N-channel cross coupled latch enable signals rtoi and sbi.

The bit line sense amplifier circuit further comprises a restore signal circuit 15 and a sensing signal circuit 16, each of which includes an active driver.

In accordance with the alternative embodiment of the present invention, there is provided a restore signal circuit or a sensing signal circuit including only an active driver using a voltage switching circuit, to drive the P-channel or N-channel cross coupled latch enable signal rtoi or sbi. The restore signal circuit is operated in response to a clock signal /R1 and a control signal cont. The sensing signal circuit is operated in response to a clock signal S1 and a control signal /cont. The control signals cont and /cont are generated from a self-delay which delays a signal /RAS. In this manner, a diode couple structure is first activated and a series couple structure is then activated.

The bit line sense amplifier circuit in FIG. 4 is substantially the same in construction and operation as that in FIG. 3 and details thereof will thus be omitted.

As apparent from the above description, according to the present invention, the driver using the voltage switching circuit is provided to perform the voltage switching operation in response to the control signal. Therefore, the voltages of the P-channel and N-channel cross coupled latch enable signals are gradually charged or discharged, resulting in a reduction in the noise component in the power supply lines.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bit line sense amplifier circuit for restoring and sensing data on a bit line in a semiconductor device, comprising:

a first restore signal circuit including a first PMOS transistor said first PMOS transistor being operated in response to a first clock signal;

a first sensing signal circuit including a first NMOS transistor, said first NMOS transistor being operated in response to a second clock signal;

a second restore signal circuit being operated in response to a first control signal and a third clock signal; and a second sensing signal circuit being operated in response to a second control signal and a fourth clock signal;

said first and second restore signal circuits being connected in parallel to each other;

said first and second sensing signal circuits being connected in parallel to each other.

2. A bit line sense amplifier circuit as set forth in claim 1, wherein said first and second restore signal circuits transfer a supply voltage and an attenuated voltage to first and second nodes, respectively, when the first control signal is low in logic and the first and third clock signals are low in logic, and the supply voltage Vcc to said first and second nodes when the first control signal is high in logic and the first and third clock signals are low in logic, said attenuated voltage being obtained by attenuating the supply voltage by a desired value, said first and second nodes being connected to a P-channel cross coupled latch in a bit line sense amplifier.

3. A bit line sense amplifier circuit as set forth in claim 1, wherein said first and second sensing signal circuits discharge a voltage on a first node to a ground voltage source when the second control signal is high in logic and the second and fourth clock signals are high in logic, and the voltage on said first node and a voltage on a second node to said ground voltage source when the second control signal is low in logic and the second and fourth clock signals are high in logic, said first and second nodes being connected to an N-channel cross coupled latch in a bit line sense amplifier.

4. A bit line sense amplifier circuit as set forth in claim 1, wherein said second restore signal circuit includes:

- a second PMOS transistor having a gate terminal for inputting the first control signal;
- a second NMOS transistor having a gate terminal for inputting the first control signal, a source terminal connected to a ground voltage source and a drain terminal connected to a drain terminal of said second PMOS transistor;
- a third PMOS transistor having a gate terminal connected in common to the drain terminals of said second PMOS and NMOS transistors, a drain terminal connected to a supply voltage source and a source terminal connected to a source terminal of said second PMOS transistor; and
- a fourth PMOS transistor having a gate terminal for inputting the third clock signal, a drain terminal connected in common to the source terminals of said second and third PMOS transistors and a source terminal connected to a node, said node being connected to a P-channel cross coupled latch in a bit line sense amplifier.

5. A bit line sense amplifier circuit as set forth in claim 1, wherein said second sensing signal circuit includes:

- a second NMOS transistor having a gate terminal for inputting the second control signal;
- a second PMOS transistor having a gate terminal for inputting the second control signal, a drain terminal connected to a supply voltage source and a source terminal connected to a source terminal of said second NMOS transistor;
- a third NMOS transistor having a gate terminal for inputting the fourth clock signal, a source terminal connected to a drain terminal of said second NMOS transistor and a drain terminal connected to a node, said node being connected to an N-channel cross coupled latch in a bit line sense amplifier; and
- a fourth NMOS transistor having a gate terminal connected in common to the source terminals of said second PMOS and NMOS transistors, a source terminal connected to a ground voltage source and a drain terminal connected to the drain terminal of said second NMOS transistor and the source terminal of said third NMOS transistor.

* * * * *